United States Patent [19]

Matsuda et al.

[11] Patent Number: 4,753,830
[45] Date of Patent: Jun. 28, 1988

[54] FILM FORMING METHOD, RECORDING MEDIUM FORMED THEREBY AND RECORDING METHOD THEREWITH

[75] Inventors: Hiroshi Matsuda, Yokohama; Masahiro Haruta, Funabashi; Yutaka Hirai, Tokyo; Yukuo Nishimura, Sagamihara; Ken Eguchi, Yokohama; Takashi Nakagiri, Tokyo, all of Japan

[73] Assignee: Canon Kabushiki Kaisha, Tokyo, Japan

[21] Appl. No.: 28,881

[22] Filed: Mar. 23, 1987

Related U.S. Application Data

[62] Division of Ser. No. 724,544, Apr. 18, 1985, Pat. No. 4,693,915.

[30] Foreign Application Priority Data

| Apr. 20, 1984 | [JP] | Japan | 59-78636 |
| May 15, 1984 | [JP] | Japan | 59-95572 |
| May 15, 1984 | [JP] | Japan | 59-95575 |
| May 15, 1984 | [JP] | Japan | 59-95576 |
| May 15, 1984 | [JP] | Japan | 59-95583 |
| May 15, 1984 | [JP] | Japan | 59-95584 |

[51] Int. Cl.[4] .......................... B05D 1/18; B41M 5/00
[52] U.S. Cl. ..................... 427/434.3; 264/298; 346/1.1; 346/135.1; 427/144; 427/150; 503/202
[58] Field of Search .......... 8/470, 471; 264/98; 346/1.1, 135.1; 427/144–146, 150–152, 256, 271, 287, 430.1, 434.3; 428/195, 207, 209, 210, 333, 411.1, 913, 914; 430/270, 271, 273, 495, 496; 503/200–202, 227

[56] References Cited

U.S. PATENT DOCUMENTS

| 4,309,453 | 1/1982 | Reiner et al. | 427/54.1 |
| 4,539,061 | 9/1985 | Sagiv | 427/407.1 |
| 4,632,800 | 12/1986 | Barraud et al. | 427/434.3 |

Primary Examiner—Bruce H. Hess
Attorney, Agent, or Firm—Fitzpatrick, Cella, Harper & Scinto

[57] ABSTRACT

A film forming method, a recording medium formed thereby, and a recording method therewith are provided. The recording medium comprises a recording layer constituted of a monomolecular film or monomolecular-layer built-up film of a clathrate complex compound comprised of a host molecule and a guest molecule, said host molecule having a hydrophilic portion, a hydrophobic portion, and a portion capable of enclosing said guest molecule.

5 Claims, 3 Drawing Sheets

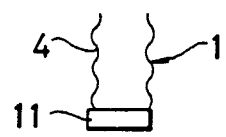
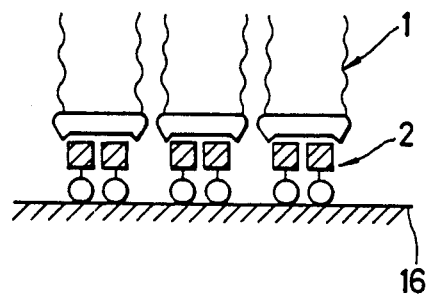
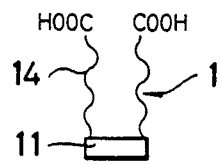
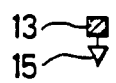
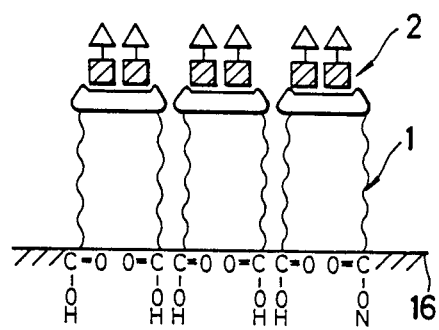

FILM FORMING METHOD, RECORDING MEDIUM FORMED THEREBY AND RECORDING METHOD THEREWITH

This is a division of application Ser. No. 724,544, filed Apr. 18, 1985, now U.S. Pat. No. 4,693,915.

BACKGROUND OF THE INVENTION

1. Field of the Invention

The present invention relates to a method for forming a monomolecular film of a clathrate complex compound and a built-up film thereof and to a recording medium and a method utilizing a chemical or physical change in such a film for recording.

2. Description of the Prior Art

Recent progress of technology in organic materials is remarkable, resulting in fabrication or proposal of various devices, for example, display or recording media, provided with films of organic materials.

Known display media utilizing organic compounds for display layers include, for example, those using organic compounds (electrochromic materials) which develop color on undergoing oxidation-reduction reaction and those using fluorescent organic compounds.

Some types of display media using electrochromic materials have been proposed (e.g. Japanese Patent Laid-open Publication Nos. 71380/73, 32958/75, 63950/75, and 136000/75). These types of display media according to the prior art all relate to the so-called organic-EC (electrochromic) display device that operates with a voltage applied across a color-forming layer made of a solution of an electrochromic material viologen derivative in a suitable electrolyte. A colored pattern is formed in this process according to the pattern of an electrode which is a component of the organic-EC device.

However, the electrochromic material in these organic-EC elements, because it is dissolved in an electrolyte, is considerably free to move and is inferior in responsiveness (the time from voltage application to color formation or disappearance). Thus, these organic-EC devices cannot serve as high-density color display devices. In addition these organic-EC elements are short in memory time and are inferior in reversibility (color formation ←→ color disappearance) because a colored substance deposited on electrodes is redissolved in the solvent (electrolyte). In order to eliminate these drawbacks of the prior art organic-EC devices, the electrochromic material is required to adhere in a highly ordered state onto the patterned electrodes of the display element.

Some types have been proposed also of luminescent display devices using fluorescent organic compounds (e.g. Japanese Patent Laid-Open Publication Nos. 35587/77 and 172891/83). These devices according to the prior art relate all to the so-call EL (electroluminescence) display device that emits light on voltage application across a luminescent display layer made of an electroluminescent compound. In particular, the device disclosed in the above Laid-Open Publication No. 35587/77 is constructed by forming a monomolecular film or monomolecular-layer built-up film of a derivative of anthracene, pyrene, or perylene having hydrophilic and hydrophobic substituents on suitable positions, on an electrode plate, and forming another electrode on the above film. It is desirable for achieving a high degree of resolution with this type of display device that luminescent molecules in the film be maintained in a highly ordered distribution state. However, the abovementioned derivatives of anthracene and other compounds are disadvantageous in that cautions and complicated operations are necessary for producing highly ordered monomolecular films or monomolecular-layer built-up films of these derivatives [Thin Solid Film, Vol. 99, pp. 71–79 (1983)].

Optical recording media using thin films of organic compounds as recording layers have been disclosed, for example, in Japanese Patent Laid-Open Publication Nos. 16948/81 and 125246/83. These Patent Application both relate to laser recording media in which recording layers of organic coloring matter are used for recording and reproducing with laser beams. In particular, the medium disclosed in the above Laid-Open Publication No. 125246/83 comprises a thin recording film of a cyanine pigment represented by the following general formula (I):

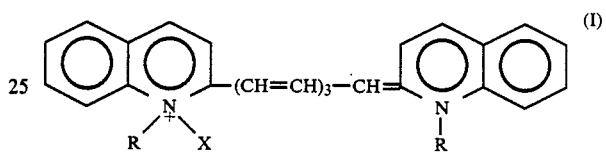

This recording film is formed by applying a solution of the cyanine pigment on a plastic substrate by means of a spinner coater to a thickness of up to 1000 Å, e.g. 300 Å. When the distribution or orientation of molecules in the film is random, the light incident on the film is scattered in the film and the degree of chemical reaction caused by light irradiation varies from time to time of the irradiation. Therefore, it is desirable for recording media that the distribution and orientation of the molecules forming the recording film be uniform, and it is requested for high density recording that the recording film be as thin as possible. However, this film when formed by coating cannot be made thinner than about 300 Å and the random distribution or orientation of molecules in the film is inevitable.

Meanwhile, Japanese Patent Laid-Open Publication Nos. 42229/81 and 43220/81, and other literature have disclosed that built-up films of diacetylene compounds already proposed as a resist material which exhibits a high quantum yield and has superior resolving power are applicable not only as a resist material but also to thin film electro-optical devices, electro-acoustic devices, piezo-pyroelectric devices, etc.

More recently, improvements of a method for producing built-up films of diacetylene compounds have been disclosed in Japanese Patent Laid-Open Publication No. 111029/83. Diacetylene compound built-up films formed on substrates according to these inventions are irradiated with ultraviolet rays either without masking to form diacetylene compound polymer films or with masking to cause the polymerization partly, and the unpolymerized portions are removed to form patterns, thereby being used for thin film optical devices and integrated circuits.

However, these patent applications are all limited to diacetylene compounds and do not describe whether information once recorded in these films used for film optical devices can be erased or not.

SUMMARY OF THE INVENTION

The present invention has been made in view of the above noted points.

An object of the invention is to provide a novel method by which (1) various functional films can be produced relatively easily, (2) films exhibiting various original functions of the component molecules can be produced without losing or impairing any of these functions, and (3) the component molecules of the produced films will be oriented in highly ordered state in a direction parallel to the film surface without any special procedure.

Another object of the invention is to provide a high-density-recording medium consisting of a thin film in which a molecular-dimensional chemical or physical change can be caused by a change of the external condition.

Still another object of the invention is to provide a high-density-recording medium consisting of a thin film superior to the prior art recording media in the degree of molecular orientation in the recording film, said molecular orientation being important to achieve such high density recording as mentioned above.

A further object of the invention is to provide various high-density-recording media different in properties by simple modification of the production procedure.

Still further object of the invention is to provide a method for recording by using the above high-sensitivity and high-resolution recording medium.

The above and other objects and advantages of the invention will become apparent from the following description.

According to an aspect of the present invention, there is provided a recording medium, which comprises a recording layer comprising a monomolecular film or monomolecular-layer built-up film of a clathrate complex compound comprised of a host molecule and a guest molecule, said host molecule having a hydrophilic portion, a hydrophobic portion, and a portion capable of enclosing said guest molecule.

According to another aspect of the present invention, there is provided a recording method, which comprises selective heating of a recording layer formed of a monomolecular film or a monomolecular-layer built-up film of a clathrate complex compound composed of host molecules having a hydrophilic portion, a hydrophobic portion, and a portion enclosing a guest molecule, and a sublimable guest molecule on a substrate, thereby subliming the guest molecules selectively to make a record.

According to still another aspect of the present invention, there is provided a method for forming a monomolecular film or monomolecular-layer built-up film of a clathrate complex compound, which comprises: dissolving host molecules having a hydrophilic portion, a hydrophobic portion, and a portion capable of enclosing guest molecules, together with the guest molecules, in a solvent; extending the resulting solution on a water surface to form a monomolecular layer of the clathrate complex compound composed of said host and guest molecules; and transferring said layer onto a substrate to form the intended monomolecular film or built-up film.

According to a further aspect of the present invention, there is provided a method for forming a monomolecular film or monomolecular-layer built-up film of a clathrate complex compound, which comprises; dissolving host molecules together with or without guest molecules in a solvent, said host molecules having a hydrophilic portion, a hydrophobic portion, and a portion capable of enclosing the guest molecule; extending the resulting solution on the surface of an aqueous solution of a water soluble guest molecule to form a monomolecular layer of a clathrate complex compound composed of said host and guest molecules; and transferring said layer onto a substrate to form a monomolecular film or a built-up film.

In this specification, the term "recording medium" includes also corresponding display media and image-forming media and the term "recording method" includes also the corresponding display method and image-forming method.

BRIEF DESCRIPTION OF THE DRAWINGS

FIG. 1 illustrates said medium in the recording step, FIG. 2 in the reproduction step, and FIG. 3 in the erasion step.

FIGS. 6 and 7 illustrate arrangements of clathrate complex molecules according to the invention on water surfaces.

DETAILED DESCRIPTION OF THE PREFERRED EMBODIMENTS

Figure 1A:
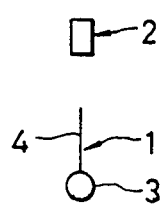
FIGS. 1 to 3 are vertical sectional views of a recording medium according to the invention.

The material constituting the recording layer of the invention comprises two species of molecules, one having a hydrophilic group, a hydrophobic group, and at least one portion capable of enclosing a molecule of other species in each molecule (this type of molecule is called a host molecule) and the other being a different species of molecules each molecule of which is enclosed in the host molecule (this type of molecule is called a guest molecule). The recording medium of the invention is produced by forming a monomolecular film or monomolecular-layer built-up film of a clathrate complex compound which is composed of such host molecules and guest-molecules.

Any host molecule can be used in the invention that has a hydrophilic group, a hydrophobic group, and at least one portion capable of enclosing a different molecule to form a clathrate complex compound, at suitable positions therein. Typical examples of the hydrophilic group and hydrophobic group are those widely known. The portion capable of enclosing a molecule of different species to form a clathrate complex compound can be constructed by introduction of a hydroxyl, carbonyl, carboxyl, ester, amino, cyano, mercapto, or imino group. Such host molecules are illustrated below by exemplifying hydroxyl-group-carrying host molecules represented by the following formula (IIa) to (IIc).

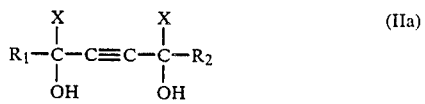
(IIa)

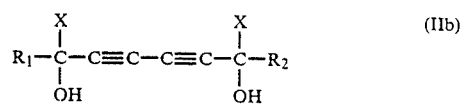
(IIb)

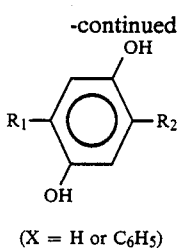

(X = H or $C_6H_5$)

The words "having a hydrophilic group and a hydrophobic group in the molecule" means that, for example, in the above formulae, either of $R_1$ and $R_2$ is a hydrophilic group and the other is a hydrophobic group or both $R_1$ and $R_2$ are more hydrophilic or hydrophobic compared with the remainder portion of the molecule. Particularly preferred hydrophobic groups as $R_1$ or $R_2$ in the above formulae are long chain alkyls of 5 to 30 carbon atoms and particularly preferred hydrophilic groups as $R_2$ or $R_1$ are fatty acid residues of 1 to 30 carbon atoms.

Suitable substances consisting of host molecules (hereinafter such as a substance is referred to as a host compound) for use in the invention include, for example, the following acetylenediol derivatives (Nos. 1-6, Nos. 16-21), diacetylenediol derivatives (Nos. 7-12, Nos. 22-27), and hydroquinone derivatives (Nos. 13-15, Nos. 28-30). In the following formulae, m and an are positive integers, Z is —$CH_3$ or —COOH, and Ph is —$C_6H_5$.

[Acetylene diol derivatives]

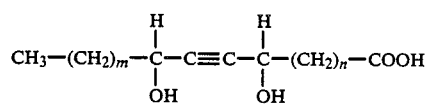

No. 1

$30 \geq m + n \geq 11, n \geq 0$

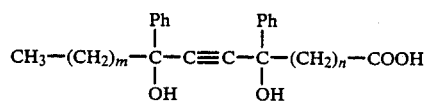

No. 2

$30 \geq m + n \geq 11, n \geq 0$

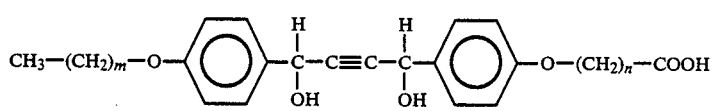

No. 3

$30 \geq m + n \geq 8, n \geq 1$

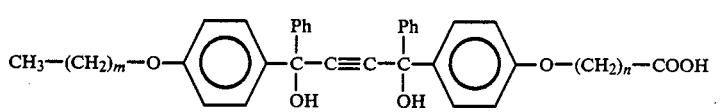

No. 4

$30 \geq m + n \geq 8, n \geq 1$

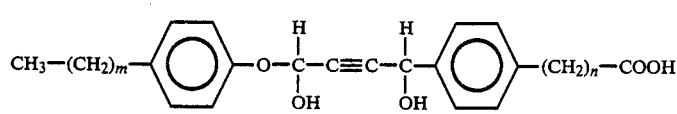

No. 5

$30 \geq m + n \geq 8, n \geq 0$

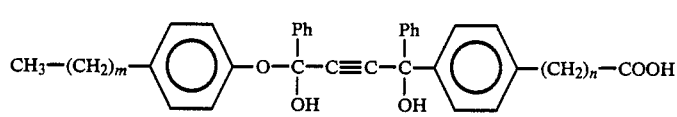

No. 6

$30 \geq m + n \geq 8, n \geq 0$

[Diacetylene diol derivatives]

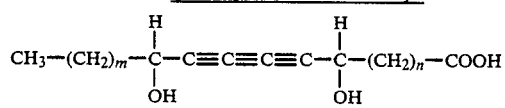

No. 7

$30 \geq m + n \geq 9, n \geq 0$

-continued
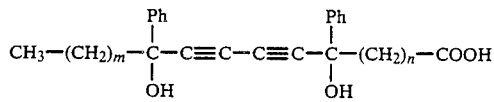 No. 8
$30 \geqq m + n \geqq 9, n \geqq 0$
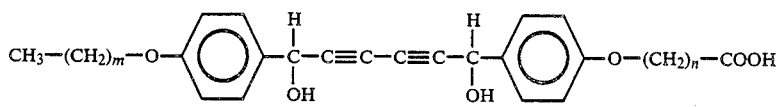 No. 9
$30 \geqq m + n \geqq 5, n \geqq 1$
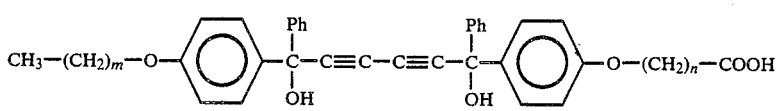 No. 10
$30 \geqq m + n \geqq 5, n \geqq 1$
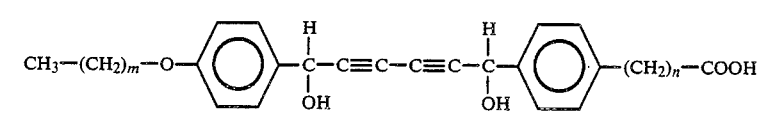 No. 11
$30 \geqq m + n \geqq 5, n \geqq 0$
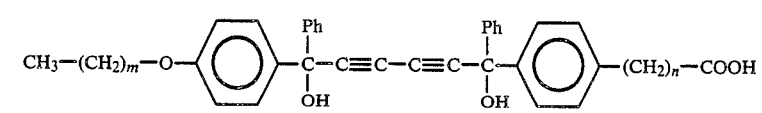 No. 12
$30 \geqq m + n \geqq 5, n \geqq 0$
[Hydroquinone derivatives]
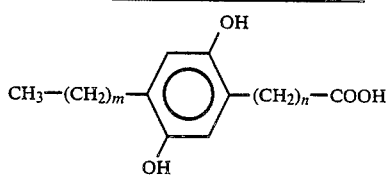 No. 13
$80 \geqq m + n \geqq 18, n \geqq 0$
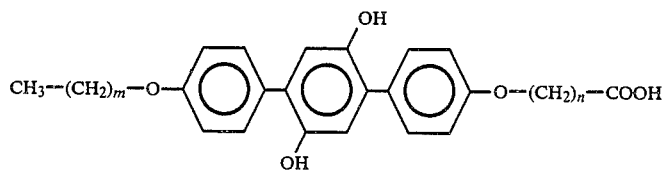 No. 14
$30 \geqq m + n \geqq 9, n \geqq 1$
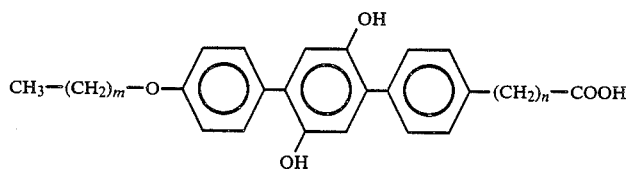 No. 15
$30 \geqq m + n \geqq 9, n \geqq 0$
[Acetylene diol derivatives]

-continued
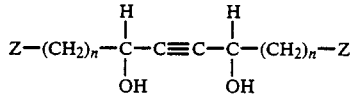
No. 16
$30 \geq n \geq 5$
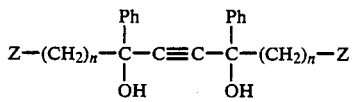
No. 17
$30 \geq n \geq 5$
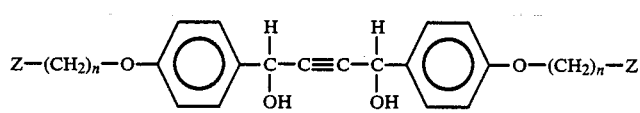
No. 18
$30 \geq n \geq 4$
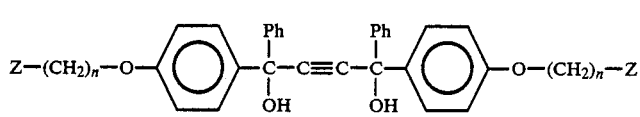
No. 19
$30 \geq n \geq 4$
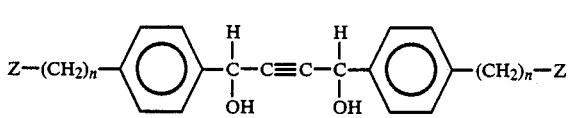
No. 20
$30 \geq n \geq 4$
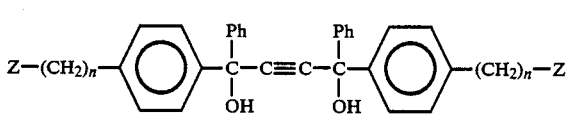
No. 21
$30 \geq n \geq 4$
[Diacetylene diol derivatives]
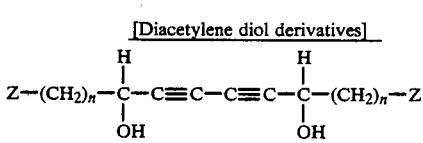
No. 22
$30 \geq n \geq 3$
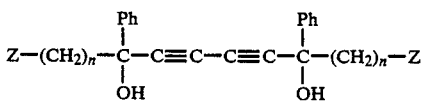
No. 23
$30 \geq n \geq 3$
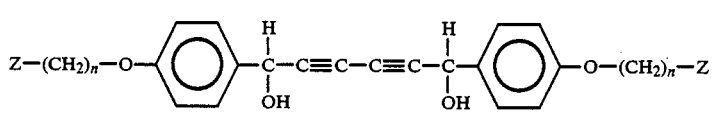
No. 24
$30 \geq n \geq 1$
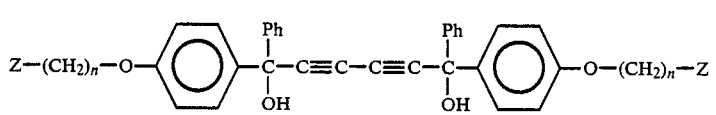
No. 25
$30 \geq n \geq 1$

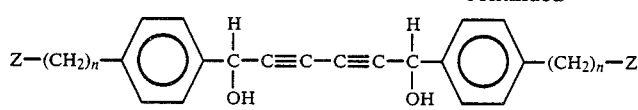
No. 26

$30 \geqq n \geqq 1$

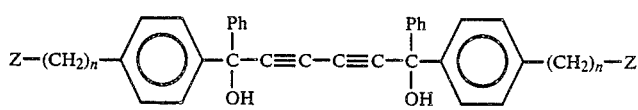
No. 27

$30 \geqq n \geqq 1$

[Hydroquinone derivatives]

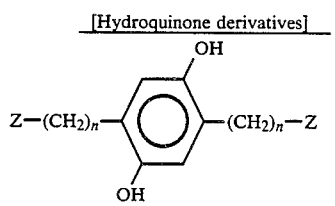
No. 28

$30 \geqq n \geqq 5$

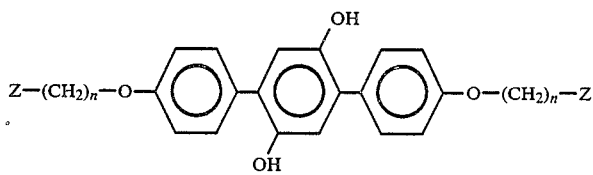
No. 29

$30 \geqq n \geqq 1$

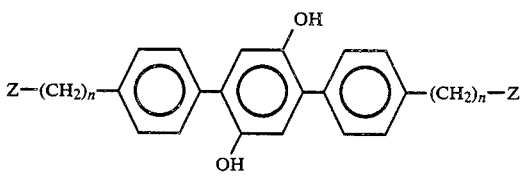
No. 30

$30 \geqq n \geqq 1$

The above cited compounds before substitution by long chain alkyls or long chain fatty acid residues as hydrophobic groups or hydrophilic groups are known compounds. It is also described in Nihon Kogaku Kaishi (Bulletin of the Chemical Society of Japan), 1983, No. 2, pp. 239–242 that the above host molecules, before modification by long-chain alkyls or long-chain fatty acid residues, together with various guest molecules form crystalline clathrate complex compounds. However, there is no report on the method for a monomecular film or monomolecular-layer built-up film of such a clathrate complex compound.

For the formation of clathrate complex compounds by combining with the above cited host compounds in the invention, it is generally desirable to use a guest compound which can form a strong hydrogen bond with a host compound. Accordingly, when the host compound to be used has hydroxyl(s), as stated above, in the portion to enclose a guest molecule, suitable guest compounds are, for example, aldehyde, ketone, amine, and sulfoxide compounds. Other acceptable guest compounds are various halogen compounds and $\pi$-electron compounds such as alkanes, alkynes, and allenes. In all cases, guest compounds are selected so that the resulting clathrate complex compounds will have such structure as to exhibit desired functions to make various devices as mentioned before.

Examples of such guest compounds, utilizable for recording media, are given below. These guest compounds can also act as solvents for film formation.

(1) Guest compounds for optical recording media wherein the dimerization of guest molecules in utilized for recording: Olefins (Nos. 31–34), diolefins (Nos. 35–38), anthracene derivatives (No. 39), acridine derivatives (No. 40), and 2-amino-pyridinium derivatives (No 41).

[Olefins]

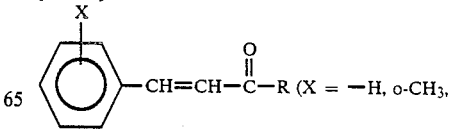
No. 31

(X = —H, o-CH$_3$, or p-CH$_3$, R = —H, —C$_6$H$_5$, —OH, or —OCH$_3$)

No. 32

[naphthalene]–CH=CH–C(=O)–R (R = —H, —C6H5, —OH, or —OCH3)

No. 33  NC—CH=CH—CN

No. 34  R1OOC—CH=CH—COOR2 (R1 = R2 = CH3 or R1 = —CH3, R2 = —H)

[Diolefins]

No. 35  Ar'—CH=CH—Ar—CH=CH—Ar'

(Ar = pyrazine; where Ar' = phenyl— or pyridyl; Ar = phenylene— where Ar' = pyridyl, , furyl, or quinolyl, benzothiazolyl No. 36  (R—C(=O)—CH=CH)2Ar (Ar = phenylene where

R = HO—, CH3O—, C2H5O—; —C6H4—O—, NH2—, or H2N—C6H4—, Ar = tolylene where R = CH3O—)

No. 37  R—C(CN)=CH—C6H4—CH=C(CN)—R (R = —COOCH3 or —COOC2H5)

No. 38  R—CH=CH—C(=O)—CH=CH—R (R = C6H5 or —COOCH3)

[Anthracene derivatives]

No. 39  [anthracene]–R (R = —CH3, —CHO, —COOC2H5, or —Br)

[Acridinium derivatives]

No. 40  [acridinium with R at 9-position, N+].X− (R = —H, —CH3, or —C2H5; X− = I−, Br−, or Cl−)

[2-Aminopyridinium derivatives].

No. 41  [2-aminopyridinium].X− (X− = Cl−, Br−, or I−)

(2) Guest compounds for recording media wherein the sublimation of guest molecules is utilized for recording: ketones (No. 42), epoxides such as 1,2-epoxypropane (No. 43), ethyleneimine (No. 44), benzene (No. 45), dichloromethane (No. 46), chloroform (No. 47), and bromides such as methyl bromide (No. 48).

No. 42  R—C(=O)—R (R = —CH3 or —C2H5)

No. 43  CH3—CH—CH2 (epoxide, O)

No. 44  CH2—CH2 (with NH)

No. 45  [benzene]

No. 46  CH2Cl2
No. 47  CHCl3
No. 48  CH3Br (3) Guest compounds for display media wherein the color formation due to the oxidation-reduction reaction of guest molecules is utilized: Viologen (No. 49) and tetrathiofulvalene (No. 50).

No. 49  R—+N[pyridyl–pyridyl]N+—R.2X−

(R = CH3 or C2H5, X− = Br−, Cl−, I−, or ClO4−)

No. 50  [tetrathiofulvalene structure]

(4) Guest compounds for display media wherein the luminescene due to the oxidation-reduction reaction of guest molecules is utilized: Polycyclic aromatic hydrocarbons (Nos. 51–59).

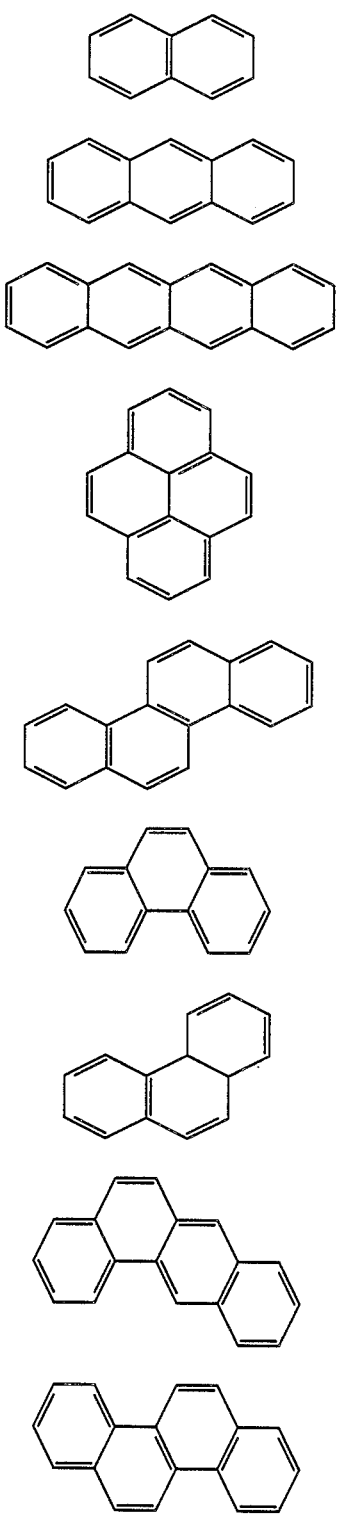

No. 51
No. 52
No. 53
No. 54
No. 55
No. 56
No. 57
No. 58
No. 59

In the invention, films of clathrate complex compounds composed of such host molecules and guest molecules as cited above are formed according to the Langmuir-Blodgett method (LB method) developed by I. Langmuir et al., which is generally known as a method for making monomecular films or monomecular-layer built-up films of organic compounds. The LB method utilizes the fact that molecules each having a hydrophilic group and a hydrophobic group, where the hydrophilicity and the hydrophobicity are suitably balanced, form a monomolecular layer on a water surface with the hydrophilic groups being directed downward. The monomolecular layer on the water surface has characteristics of a two-dimensional system. When the molecules are sparsely scattered, a relation represented by the equation of two-dimensional ideal gas $$\pi A = kT$$

exists between the surface pressure $\pi$ and the surface area A of each molecule (k: Boltzman's constant; T: absolute temperature). The layer in this state is called "a gas film". When A is reduced sufficiently, the molecular interaction increases and the layer becomes a "condensed film or solid film", namely, a two-dimensional solid. This condensed film can be transferred one by one onto substrates of various materials and shapes including glass plates. In the LB method, a monomolecular film or monomolecular-layer built-up film can be formed on a substrate from the condensed film in the following manner: A flat substrate held upright (the surface is perpendicular to the water surface) is moved across the condensed film (vertical dipping method), or a flat substrate held horizontal (the surface is parallel to the water surface) is brought into contact with the condensed film (horizontal contact method). Alternatively, a cylindrical substrate held on the condensed film so that the cylinder axis will be horizontal is rotated around the axis (cylinder rotation method). The following five processes A to E can be given as examples of the method of the invention for forming a monomolecular film of host molecules containing guest molecules (hereinafter this film is referred to as a complex monomolecular film) or a complex monomolecular-layer built-up film by utilizing the LB method.

[A] Host molecules and guest molecules, capable of forming an intended clathrate complex, are dissolved in a solvent such as benzene or chloroform. The resulting solution is extended on a water surface to deposit the clathrate complex compound in a film form on the water surface. When the host molecule in this case has a hydrophilic group (carboxyl) at one end thereof and a hydrophobic group (alkyl) at the other end like to host molecules Nos. 1-15 shown above, the clathrate complex compound extended on the water surface directs the hydrophilic group of the host molecule towards the water regardless of the hydrophilicity and hydrophobility of the guest molecule. On the other hand, when the host molecule 1 has a structure as the above cited Nos. 16-30 and both the ends thereof are constructed of hydrophobic groups Z=—CH$_3$ only, the clathrate complex compounds extended on the water surface 16 directs the hydrophilic groups of the guest molecule 2 towards the water as shown in FIG. 6. When both the ends of the host molecule like Nos. 16-30 are constructed of hydrophilic groups Z=—COOH only, the clathrate complex compound extended on the water surface directs the hydrophilic groups of the host molecule towards the water.

Then a partition plate or float is set on the water surface so that the clathrate complex compound will not so freely diffuse on the water surface as to spread excessively, that is, the aggregation state of the clathrate complex compound is controlled to restrict the extension area thereof. Thus, the clathrate complex compound acquires a surface pressure π in proportion to the degree of the aggregation. The partition plate is then gradually moved to narrow the extension area of the clathrate complex compound and raise the surface pressure to a suitable value for the production of the complex monomolecular film or built-up film. While this surface pressure is maintained, a clean-surface substrate is moved gently across the monomolecular layer of the clathrate complex compound, (vertical dipping method). Thereby the monomecular layer is transferred onto the substrate. A built-up film consisting of a desired number of complex monomolecular layers is formed by repeating the above procedure.

The complex monomolecular layer on a water surface can be transferred not only by the vertical dipping method but also by the horizontal contact method and the cylinder rotation method mentioned above. According to the vertical dipping method, with a substrate having a hydrophilic surface taken up from the water across the condensed film, a complex monomolecular film is formed on the hydrophilic surface of the substrate with the hydrophilic groups of the host molecules being directed towards the substrate. On moving the substrate up and down as stated above, one complex monomolecular layer is built up by each movement. The orientation direction of the molecules in each built-up layer fomred in the uptake step is opposite to that in each layer formed in the immersing step. Therefore the vertical dipping method gives a Y-type built-up film, in which the hydrophilic groups of the host molecules in adjacent layers confront with each other and also hydrophobic groups of the host molecules in adjacent layers confront with each other. In contrast to this, the horizontal contact method forms a complex monomolecular layer on a substrate with the hydrophobic groups of the host molecules being directed to the substrate. The successive building-up of monomolecular layers by this method results in no turnover of molecular orientation direction but forms an X-type built-up film, in all the layers of which the hydrophobic groups are directed to the substrate. On the contrary, the built-up film in all the layer of which the hydrophilic groups are directed towards the substrate is called the Z-type built-up film.

The condensed film on the water surface can also be transferred onto a substrate by the cylinder rotation method. However, the way to transfer the condensed film to a substrate is not limited to the above three methods. When large area substrate are employed, another possible method is to unwind a roll of substrate and introduce the substrate in the form of continuous sheet into water. In addition, the above described directions of hydrophilic groups and hydrophobic groups relative to substrates are true as a general rule; these directions can be changed by surface treatment of the substrate.

In the film-forming process, the orientation of molecules in the film has been controlled mainly by regulating the surface pressure up to now. According to this method, it is very difficult to obtain a film of highly ordered molecular orientation unless the film material is a considerably simple compound, for example, a linear fatty acid. According to the invention, however, highly ordered films can be obtained relatively easily since clathrate complex compounds are used as film materials.

In the monomolecular layer of clathrate complex compound formed on a water surface, the steric arrangement of host-to-host molecules, host-to-guest molecules, and guest-to-guest molecules are fixed depending on hydrogen bonds or van der Waals' forces therebetween and these host and guest molecules are arranged in an ordered state like in a crystal lattice. When the guest molecule alone has a special function, no chemical modification of the guest molecule, i.e., no introduction of hydrophilic or hydrophobic group, is necessary and hence the deterioration of the film function caused by usch a film preparation process does not occur.

[B] A solution of host molecules in a solvent is extended on the surface of water in which guest molecules have been dissolved. The host molecules enclose the guest molecules to form a clathrate complex compound, which appears in film form on the water surface. The combination of host and guest molecules and the film formation procedure thereafter are as shown in [A] above.

[C] Host molecules and guest molecules which will constitute an intended clathrate complex compound are dissolved in a solvent, and extended on the surface of water in which guest molecules have been dissolved, thereby forming a film of the clathrate complex compound on the water surface. The combination of the host and the guest molecules and the film formation procedure thereafter are as shown in [A] above.

[D] A solution of host molecules in a solvent is extended on the water surface. Then the upper space in a closed vessel containing water is filled with a guest molecule gas. Then, host molecules take guest molecules in from the gas phase to form a film of clathrate complex compound on the water surface. This method is effective especially for the readily vaporizable guest compound having a low boiling point. The combination of host and guest molecules and the film formation procedure thereafter are as shown in [A] above.

[E] The gas phase, i.e. upper space atmosphere in a close vessel containing water is supplied with a guest molecule gas. Host molecules and guest molecules which will constitute an intended clathrate complex compound are dissolved in a solvent, and extended on the water surface to form a film of the clathrate complex compound. The combination of host and guest molecules and the film formation procedure thereafter are as shown in [A] above.

Complex monomolecular films and complex monomolecular-layer built-up films formed on substrates by the above described processes have high densities and high degrees of order. Using these films as recording layers, recording media can be obtained in which high density, high resolution recording is possible in optical, thermal, electrical, or magnetic recording, etc. depending on the function of the clathrate complex compound.

The invention is described in more detail referring to the recording media or display media as examples having complex monomolecular films or complex monomolecular-layer built-up films formed by the above processes.

[1] Optical recording media with photo-dimerizable guest molecules (cf. FIGS. 1-3):

A clathrate complex compound with a host-to-guest molar ratio of 1:2 is formed by combining, for example, a compound (host molecule 1) selected from the host compounds Nos. 7-15 and Nos. 22-30 with a compound (guest molecule 2) selected from guest compounds Nos. 31-38, which have a photo-dimerizable double bonds in the molecule. When a monomolecular film or monomolecular-layer built-up film of this clathrate complex compound is irradiated with a pattern of rays 6, such as γ-rays, X-rays, or ultraviolet rays, which can afford energy necessary for polymerization, the dimerization of the guest molecules present in the irradiated areas 7 takes place as shown by the following equation III:

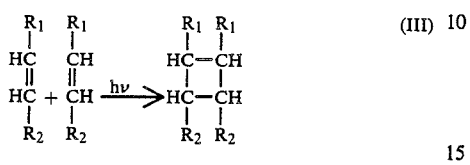

Figure 1B:
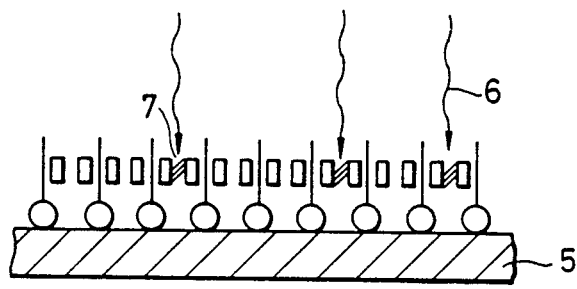

Such dimerization may take place when the distance between the respective unsaturated bonds of two adjacent guest molecules is not more than 4 Å. In the complex monomolecular film or complex monomolecular-layer built-up film formed by the above described process, not only the dimer can be readily formed but also only one type of isomer or structure is produced among various possible types thereof. That is, the configuration of guest molecules in the clathrate complex compound layer is in extremely good order. The dimer once formed does not depolymerize even in the dark and the monomer in the unirradiated areas remains as such. Thus a record according to the pattern of rays is made in the film as shown in FIG. 1.

Figure 2:
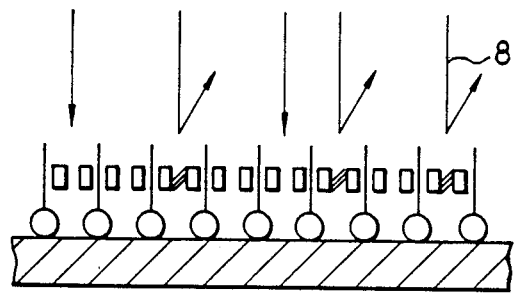

The recorded information is read out, for instance, by irradiating the film with visible rays 8. Since conjugated double bonds disappear on the dimerization, the absorption spectrum for visible rays is altered. That is, the absorption maximum shifts toward the shorter wavelength side. Hence the recorded information is reproduced by reading out the change in the absorption spectrum (FIG. 2).

The reproduction can be accomplished, besides by reading the change in the absorption spectrum with visible rays, also by reading the volume change due to the dimerization according to the schlieren method. This method is suited in particular for the complex monomolecular films and complex monomolecular-layer built-up films containing guest compounds which exhibit large volume changes on dimerization. Moreover, in the case of a recording medium prepared by forming a complex monomolecular film or built-up film containing dimerizable guest molecules not directly on a substrate but on a photoconductor layer such as an Se, ZnO, or CaS layer laid on a substrate, for example, a flat plate, the recorded information can be reproduced by reading electrically the difference in absorbance between the monomer and the dimer.

Figure 3:
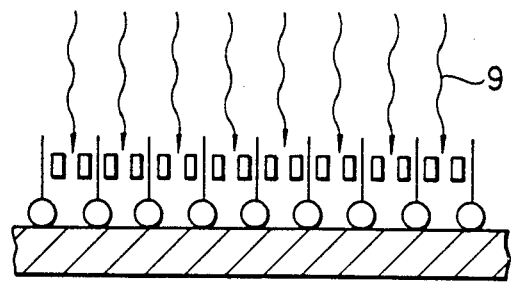

The above dimer molecule, having an absorption maximum assigned to the cyclobutane ring at 270 nm, is returned into two molecules of original monomer by irradiating with ultraviolet rays of wavelength 270 nm. Thereby the recorded information can be erased (FIG. 3).

It is also possible to use an anthracene derivative such as compound No. 39 as a photo-dimerizable guest compound. The photo-dimerization in this case proceeds as shown by the equation (IV):

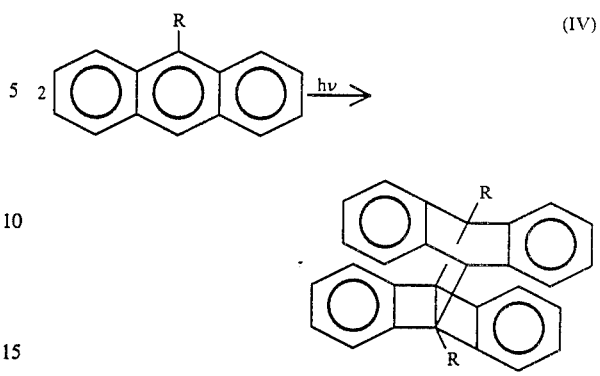

When compound No. 7 is used as a host compound for a recording medium, the polymerization of host molecules as shown by the following equation V takes place in the areas irradiated with rays such as X-rays, γ-rays, or ultraviolet rays which can afford energy necessary for the polymerization, thus forming polydiacetylene.

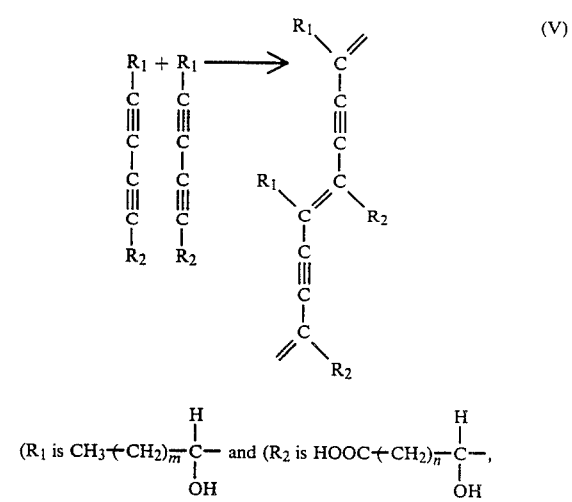

(wherein $30 \geq m+n \geq 9$, $n \geq 0$)

Hence the adhesion of the complex monomolecular film or built-up film to the substrate can be enhanced markedly by exposing the entire area of the film to such rays as mentioned above. In particular the chemical resistance (solvent resistance) of the film is improved. The guest molecules in the film, when photo-dimerizable, are dimerized by such entire-area exposure. However, this irradiated medium can also be used as a recording medium by irradiating, contrary to the above case, with a pattern of ultraviolet rays of the same wavelength as that of the absorption maximum due to the cyclobutane ring, to depolymerize the dimer.

The film thickness in the optical recording media described above is preferably in the range of 100 to 3000 Å.

[2] Recording media with sublimable guest molecules:

A clathrate complex compound with a host-to-guest molar ratio of 1:1 to 1:2 is formed by combining a compound selected from host compounds Nos. 1–30 with a compound selected from guest compounds Nos. 42–48. When a monomolecular film or monomolecular-layer built-up film of this clathrate compound is irradiated with a pattern of rays, such as laser beams or electron beams which have enough energy to dissociate the clathrate compound and gasify guest molecules, a record according to the pattern is made in the film since the guest molecules vaporize in the irradiated areas and remain as such in the unirradiated areas.

When guest compound No. 42 is used, the recorded information is reproduced by detecting the ultraviolet absorption due to the carbonyl groups of the guest compound. The reproduction is also possible by reading the structural change of the film due to the laser or electron beam irradiation, according to the schlieren method. This method is also effective when guest compounds Nos. 42–48 are used. Moreover, in the case of a recording medium prepared by forming a complex monomolecular film or built-up film containing guest compound No. 42 on a photoconductor layer such as an Se, ZnO, or CdS layer, the recorded information can be reproduced by reading electrically the difference of absorbance between the clathrate compound area and the guest molecule-free area.

The film thickness in the recording media described above is preferably in the range of 100 to 1000 Å.

Figure 4:
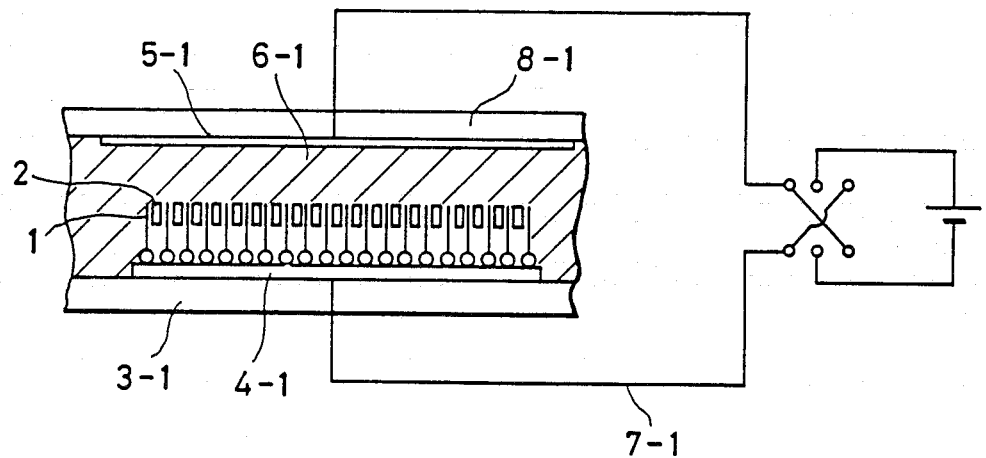
FIGS. 4 and 5 are vertical sectional views of display media according to the invention.

[3] Display medium utilizing color formation by oxidation-reduction reaction of guest molecules (cf. FIG. 4):

A clathrate compound is formed by combining, for example, any of host compounds No. 1–No. 30 (host molecule 1) with any of guest compounds No. 48–No. 50 (guest molecule 2). A display layer consisting of a monomolecular film or built-up film of the clathrate compound is formed on an electrode 4-1 supported by a substrate 3-1 (a flat plate in this case). In place of the substrate 3-1 and the electrode 4-1, it is possible to use another substrate which sources also as an electrode. A cell 8-1 is formed, in which an electrolyte solution 6-1 is poured so as to cover the film. Then a counter electrode 5-1 insulated from the electrode 4-1 (display electrode) is provided at a part of the cell 8-1, thus completing a display medium. The electrode 5-1 may constitute a part of the substrate 3-1. In this display medium, both or one of the substrate 3-1 and the cell 8-1 needs to be formed of a transparent material (e.g. glass) and the electrode adhering to the transparent member needs to be transparent. On applying a d.c. voltage to the thus formed display medium with the electrode 4-1 as cathode and the counter electrode 5-1 as anode, guest molecules are reduced to develop color. When the guest compound is viologen (No. 49), this reduction proceeds as follows:

59 (guest molecule 2) capable of exhibiting electroluminescence. A display layer consisting of a monomolecular film or built-up film of the clathrate compound is formed on a substrate 9-1 (a flat plate in this case) which can serve also as an electrode. Then, the film is covered with another electrode plate 10-1. At least one of the two electrodes is made of a transparent material. On passing an electric current through the thus formed display medium, guest molecules on the cathode side are reduced to emit light.

Consequently, a luminous pattern can be displayed when one of the electrodes has been formed according to a pattern and a voltage is applied between the electrodes.

The thickness of the display layer is preferably in the range of 3000 to 10,000 Å.

In the above described embodiments of the invention, the substrate for supporting the complex monomolecular film or built-up film is not particularly restricted. But the surface of the substrate must be cleaned since a surface active material, if attached to the substrate surface, will disorder the complex monomolecular film when it is transferred from a water surface thus causing disorder of the complex monomolecular film and preventing the formation of a good complex monomolecular film or built-up film. Suitable materials for the substrate are, for example, glasses, metals such as aluminum, plastics, and ceramics.

The complex monomolecular film or built-up film is fixed strongly enough so that the flaking or scaling of the film from the substrate scarcely occurs. However, an adhesion layer may be provided between the substrate and the film or between the layers of the built-up film for the purpose of further enhancing the adhesion. The adhesion can also be enhanced by proper selection of conditions in the formation of the complex monomolecular layer on a water surface, for example, the pH and ion species in the water, the water temperature, the speed of substrate uptake or sinking, and the surface pressure.

It is favorable to cover the monomolecular film or built-up film with a protective film for improving the chemical stability of the recording medium, though the protective film may be unnecessary depending on the film-constituting molecules chosen.

The invention is illustrated in more detail with reference to the following examples of the preparation of the above described recording media and display media. Compounds No. 60–No. 65 used in the following exam-

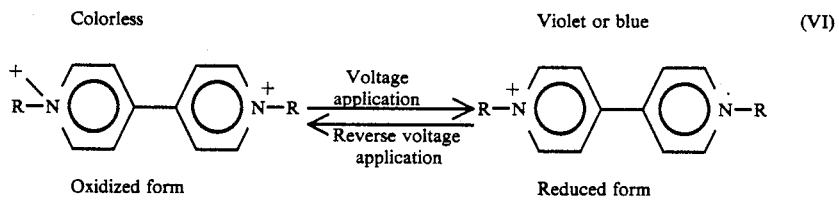

Colorless      Violet or blue      (VI)

Oxidized form      Reduced form

Consequently, a colored pattern can be displayed when the display electrode 4-1 has been fabricated into a pattern form. The thickness of the display layer is preferably in the range of 100 to 500 Å.

Figure 5:
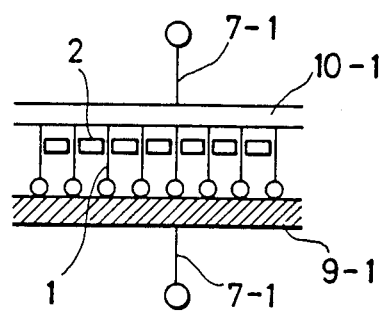

[4] Display medium utilizing luminescence by oxidation-reduction reaction of guest molecules (cf. FIG. 5):

A clathrate compound is formed by combining, for example, any of host compounds No. 1–No. 30 (host molecule 1) with any of guest compounds No. 51–No.

ples are as shown in Table 1 later.

EXAMPLE 1

Optical recording medium (1) with photodimerizable guest molecules:

A diacetylenediol derivative, No. 60, as host compound and chalcone as guest compound were dissolved at a molar ratio of 1:2 in chloroform. The solution was extended on the surface of a $4\times 10^{-4}$M aqueous solution (pH 6.5) of cadmium chloride. After removal of chloroform by vaporization, the surface pressure of the formed monomolecular layer of the clathrate compound was raised to 35 dynes/cm. While keeping this surface pressure constant, the monomolecular layer was transferred onto a sufficiently cleaned hydrophilic surface of a glass base plate by moving it gently in the vertical direction at a speed of 7 cm/min across water surface carrying the monomolecular layer. In this way, a complex monomolecular film and built-up films composed of 3, 5, 9, 15, and 19 complex monomolecular layers were formed respectively on a base plates. Thus optical recording media comprising these films as respectively a recording layer were prepared. In the operation of building up of the monomolecular layers, the film-supporting plates, after each uptake from water, were left standing for 30 minutes or more to remove the adherent water therefrom by evaporation. For the film formation, an instrument, Langmuir-Trough 4, supplied by Joyce Co., Ltd., England, was used.

The prepared optical recording media were irradiated by X-rays with a pattern to cause the dimerization of the following equation VII of guest molecules in the irradiated areas, thereby recording information. The results proved that molecular-dimensional high-density recording is possible in these media.

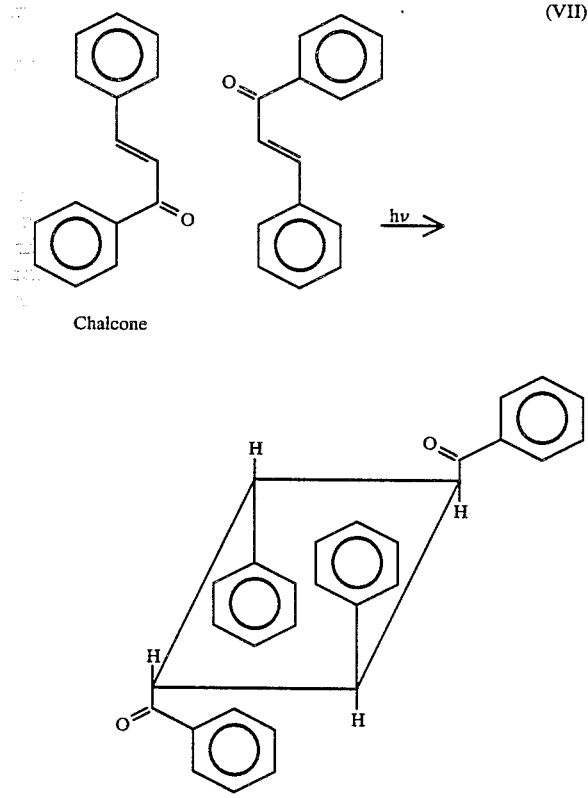

(VII)

The record was reproduced by reading the absorbance change in the wavelength range of about 300–420 nm due to the dimerization of the guest molecules. The irradiation with ultraviolet rays of wavelength 270 nm for 1 hour caused the depolymerization of the dimer, erasing the record.

EXAMPLES 2-12

Similar results as in Example 1 were obtained by using each of guest compounds No. 31 to No. 38 in place of chalcone (Examples 2-9).

When chalcone as a guest compound and each of the host compounds No. 61 to No. 63 were used, the recording of information and the reproducing and erasing of records were possible with rays similarly to Example 1 (Examples 10-12).

EXAMPLES 13-24

Optical recording medium (2) with photodimerizable guest molecules:

Optical recording media of Examples 1-12 were first subjected to overall uniform exposure to a high-pressure mercury lamp to dimerize all the guest molecules. Then the resulting media were irradiated with a pattern by ultraviolet rays of wavelength about 270 nm, which corresponds to the absorption maximum of the cyclobutane ring produced by the dimerization, to depolymerize the dimer in the irradiated areas, thereby recording information. The results should that molecular-dimensional recording is possible in these recording media. The records were reproduced by reading the absorbance change at wavelengths of about 380–420 nm due to the depolymerization. Further it was confirmed that the records can be erased, in other words, all the monomeric guest molecules can be dimerized, by exposing again the entire area of the recording media to a high-pressure mercury lamp.

EXAMPLE 25

Optical recording medium (3) with photodimerizable guest molecules:

Using a diacetylenediol derivative, No. 64, as a host compound and cinnamic acid as a guest compound, a complex monomolecular film and built-up films of 3, 5, 9, 15, and 19 complex monomecular layers respectively were formed in the same manner as in Example 1, to prepare optical recording media having these films as respective recording layers. The entire area of each film was exposed to a high-pressure mercury lamp to dimerize the guest molecules (equation VIII). and polymerize the host molecules (equation V). Then, the films were irradiated with a pattern by ultraviolet rays having a wavelength of 270 nm to depolymerize the dimer in the irradiated areas, thereby recording information. The results showed that molecular dimensional recording is possible in these recording media.

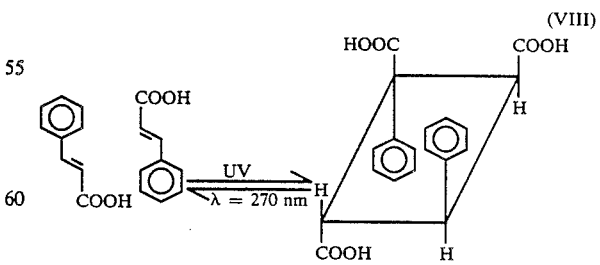

(VIII)

The records were reproduced by reading the absorbance change at wavelengths of about 380–420 nm due to the depolymerization of the dimer.

Further it was confirmed that the records can be erased by exposing again the entire area of each recording medium to a high-pressure mercury lamp. The recording media once subjected to the entire area exposure to a high-pressure mercury lamp were dipped in alcohol for about 30 seconds, and the recording and reproduction of information were made as stated above, where no particular difficulty was encountered. Thus it was ascertained that the chemical resistance of the recording media is enhanced by polymerizing the host molecules.

EXAMPLES 26 and 27

A diacetylene derivative, No. 64, as a host compound and anthraldehyde as a guest compound were dissolved at a molar ratio of 1:2 in chloroform. Using this solution, a complex monomolecular film and built-up films of 5, 9, 15, 31, 60, and 80 complex monomolecular layers respectively were formed in the same manner as in Example 1. Thus optical recording media having these films as respective recording layers were prepared.

These recording media were irradiated with a pattern by X-rays to cause the dimerization of equation (IV) of the guest molecules in the irradiated areas thereby achieving molecular dimensional recording of information. The records were reproduced by reading the absorbance change at wavelengths of about 370–390 nm due to the dimerization of the guest molecules. Further it was ascertained that the records can be erased by one-hour irradiation with ultraviolet rays of wavelength 313 nm to depolymerize the dimer.

Similar results were obtained when an anthracene derivative of No. 41 was used as a guest compound (Example 27).

EXAMPLE 28

Recording method (1) utilizing sublimation of guest molecules:

An acetylenediol derivative, No. 65, as a host compound was dissolved in chloroform. The solution was extended on the surface of a $4 \times 10^{-4}$M aqueous solution (pH 6.5) of cadmium chloride. After removal of the solvent chloroform by evaporation, the gas phase was saturated with acetone vapor. Under the acetone atmosphere, the surface pressure of the formed complex monomolecular layer was raised to 35 dynes/cm and the then the acetone atmosphere was replaced with air or nitrogen. While keeping this surface pressure, the complex monomolecular layer was transferred onto a sufficiently cleaned surface of a glass base plate by reciprocating it gently in the vertical direction at a speed of 2 cm/min across the water surface carrying the monomolecular layer. In this way, a complex monomolecular film and built-up films of 3, 5, 9,15, 19, 40, 60, and 80 complex monomolecular layers were formed. Thus, recording media having these films as respective recording layers were prepared. In the building-up operation, the film-supporting plates, after each uptake from water, were left standing fo 30 minutes or more to remove the adherent water therefrom by evaporation. In this case also, the Langmuir-Trough 4 mentioned in Example 1 was used as a film forming instrument.

The thus obtained recording media were irradiated with an intended pattern by carbon dioxide gas laser beams or infrared laser beams, thereby resulting in the sublimation and removal of guest molecules, i.e. acetone molecules, from the irradiated areas and a decrease in the absorbance at $\lambda$ max=280 nm of the irradiated areas. Thus molecular dimensional recording of information was achieved in these recording media. The records can be reproduced by detecting the guest molecule according to the schlieren method. On standing the laser-irradiated recording media in an acetone atmosphere for one hour, acetone molecules were again taken in to be enclosed at the acetone-freed sites. Thus the records were erased and the media could be reused for recording. It was ascertained that these recording media can be used repeatedly withstanding this recording-erasing operation at least several tens of times.

EXAMPLES 29–32

Similar results as in Example 28 were obtained by using each of host compounds No. 60 to No. 63 in place of the host compound No. 65.

EXAMPLES 33–38

Recording method (2) utilizing sublimation of guest molecules:

Each of host compounds No. 60 to No. 63, dissolved in chloroform, was extended on the surface of a $4 \times 10^{-4}$M aqueous solution (pH 6.5) of cadmium chloride. In this step, the gas phase was made to be nearly saturated with chloroform vapor. After the chloroform on the water surface had vaporized almost completely (for about 5 minutes), the surface pressure of the formed complex monomolecular layer was raised to 35 dynes/cm and then the chloroform atmosphere was replaced with air or nitrogen. While keeping this surface pressure, the complex monomolecular layer was transferred onto a sufficiently cleaned surface of a glass base plate by reciprocating it gently in the vertical direction at a speed of 2 cm/min across the monomolecular layer. In this way, a complex monomolecular film and built-up films of 3, 5, 9, 15, and 19 complex monomolecular layers were formed respectively on the glass plates. Thus recording media having these films as repsective recording layers were prepared.

These recording media were irradaited with an intended pattern by carbon dioxide gas laser beams or infrared laser beams, thereby resulting in the sublimation and removal of guest molecules, i.e. chloroform molecules, from the irradiated areas. Thus molecular dimensional recording was achieved in these recording media. The records can be reproduced by reading the deformation in the films or the change in refractive index due to the local elimination of guest molecules, according to the schlieren method. On standing the laser-irradiated recording media in a chloroform atmosphere for one hour, chloroform molecules were taken in to form clathrate molecules again, thereby erasing the records and enabling the reuse of the recording media for recording. It was ascertained that these recording media can be used repeatedly withstanding this recording-erasing operation at least several tens of times.

Results similar to the above were obtained when benzene (No. 45, Example 37) and dichloromethane (No. 46, Example 38) were each used as a guest compound which acts as the solvent at the same time.

EXAMPLES 39–44

Recording method (3) utilizing sublimation of guest molecules:

Each of host compounds No. 60 to No. 63 and 1,2-epoxypropane (No. 43) as a guest compound were dissolved in a molar ratio of 1 : 2 in chloroform. The solution was extended on the surface of a $4 \times 10^{-4}$ M aqueous solution (pH 6.5) of cadmium chloride. After removal of the solvent chloroform by evaporation, the surface pressure of the formed complex monomolecular layer was raised to 35 dynes/cm. While keeping this surface pressure, the complex monomolecular layer was transferred onto a sufficiently cleaned hydrophilic surface of a glass base plate by reciprocating it gently at a speed of 7 cm/min in the vertical direction across the water surface carrying the monomolecular layer. In this way, a complex monomolecular film and built-up films of 5, 9, 15, and 31 complex monomolecular layers were formed respectively on the glass base plates. Thus recording media having these films as respective recording layers were prepared (Examples 39–42). In this case, 1,2-epoxypropane (No. 43) was previously dissolved in the water to an approximate concentration of 1 to 10M to prevent the diffusion of guest 1,2-propane molecules from the monomolecular layer into the water. Methods and results of recording, reproduction, and erasing of information were similar to those in Examples 28.

Results similar to the above were obtained when acetone and ethylenimine (No. 44) were each used as a guest compound.

EXAMPLES 45–48

Recording method (4) utilizing sublimation of guest molecules:

Each of host compounds No. 60 to No. 63 and a guest compound methyl bromide (No. 48) were dissolved in a molar ratio of 1:2 in chloroform. The solution was extended on the surface of a $4 \times 10^{-4}M$ aqueous solution (pH 6.5) of cadmium chloride. After removal of the solvent chloroform by vaporization, the surface pressure of the formed complex monomolecular layer was raised to 35 dynes/cm. While keeping this surface pressure, the complex monomolecular layer was transferred onto a sufficiently cleaned hydrophilic surface of a glass base plate by reciprocating it gently at a specd of 7 cm/min in the vertical direction across the water surface carrying the monomolecular layer. In this way, a complex monomolecular film and built-up films of 5, 9, 15, and 31 complex monomolecular layers were formed respectively on the glass base plates. Thus recording media having these films as respective recording layers were prepared. Methods and results of recording, reproduction, and erasing of information were similar to those in Example 28.

EXAMPLES 49–55

Recording method (5) utilizing sublimation of guest molecules:

A complex monomolecular film and built-up films of 3, 5, and 9 complex monomolecular layers were formed respectively from a host compound No. 64 and each of guest compounds No. 42 to No. 48. The film forming method in this case somewhat varies depending on the species of guest molecule used; films were formed by the methods described in Examples 28–48. The entire area of each formed film was exposed to a high-pressure mercury lamp to polymerize host molecules, thereby preparing a recording medium.

Methods and results of recording, reproduction, and erasing of information in these examples were similar to those in Example 28. According to the above preparation method, the bonding strength of host molecules to the base plate becomes higher than according to the methods in Examples 28–44. Therefore, also the chemical resistance of recording media becomes relatively high; that is, these recording media were found to withstand at least 100 recording-erasing cycles.

EXAMPLES 56–59

Display media utilizing color formation by oxidation-reduction reaction of guest molecules:

Each of host compounds No. 60 to No. 63 and methylviologen as a guest compound were dissolved in a molar ratio of 1:1 or 1:2 in chloroform. The solution was extended on the surface of a $4 \times 10^{-4}M$ aqueous solution (pH 6.5) of cadmium chloride. After removal of the solvent chloroform by evaporation, the surface pressure of the formed complex monomolecular layer was raised to 35 dynes/cm. While keeping this surface pressure, the complex monomolecular layer was transferred onto a transparent electrode (display electrode) 4-1 supported by a glass base plate 3-1 by reciprocating it gently in the vertical direction at a speed of 2 cm/min across the monomolecular layer. In this way, a complex monomolecular film and built-up films thereof were formed respectively as display layers on the electrode. Then a counter electrode 5-1 was prepared from gold in such a manner as to surround the display electrode 4-1, and the cell 8-1 was provided in combination with a glass cover and with electrolyte solution (aqueous KBr 0.3M solution) 6-1 filled in the room therein.

On applying a d.c. voltage to each display medium with the display electrode 4-1 as a cathode, a blue color developed in the shape of the display electrode 4-1 in the film. In particular, satisfactory color formation was observed in the display media of 5- to 21- layered built-up films. The color disappeared on application of a reverse voltage. These display media were found to withstand at least 5000 color formation-disappearance cycles.

Display media prepared in various patterns by following the above procedure, gave high-density images with high degrees of resolution in all cases.

EXAMPLES 60–63

Display media utilizing luminescence by oxidation-reduction reaction of guest molecules:

Each of the host compounds No. 60 to No. 63 and anthracene (No. 52) as the guest compound were dissolved in a molar ratio of 1:1 or 1:2 in chloroform. The solution was extended on the surface of a $4 \times 10^{-4}M$ aqueous solution (pH 6.5) of cadmium chloride. After removal of the solvent chloroform by evaporation, the surface pressure of the formed complex monomolecular layer was raised to 35 dynes/cm to form a film of a clathrate complex compound. While keeping this surface pressure, the complex monomolecular layer was transferred onto an NESA glass base plate 9-1 which acts as a transparent electrode, by reciprocating the plate gently in the vertical direction at a speed of 0.7 cm/min across the monomolecular layer. In this way, a complex monomolecular film and builtup films of 9, 19, 51, 101, 201, and 401 complex monomolecular layers were prepared respectively as a display layer on the electrode. The film sides of the resulting laminates were overlaid by vapor deposition with aluminum 10-1 of 300 Å in thickness which acts as a counter electrode, thus preparing display media.

On applying a d.c. or a.c. voltage of 45V to these display media, blue luminescence was observed in the display layers. This luminescence disappeared on removing the voltage. In particular, intense luminescence was observed in the display media of built-up films of 101 layers and more.

Display media different in the pattern of display electrode, prepared by following the above procedure, gave high-density images with high degrees of resolution in all cases.

TABLE 1

| Compound No. | Host compounds used | |
|---|---|---|
| | Skeletal base compound No. | Notations |
| 60 | 10 | $m = 9, n = 2$ |
| 61 | 25 | $Z = COOH, n = 2$ |
| 62 | 15 | $m = 9, n = 2$ |
| 63 | 30 | $Z = COOH, n = 4$ |
| 64 | 7 | $m = 8, n = 8,$ |
| 65 | 4 | $m = 9, n = 2$ |

As described hereinbefore, the invention has the following advantages:

(1) various functional films can be produced relatively easily, (2) these films can be produced so that various original functions of the component molecules in the films will be exhibited without being lost or impaired, (3) the films can be produced so that the component molecules will be oriented in a highly ordered state without any special operation, and (4) various organic devices of high quality can be provided with ease.

With the recording media of the invention, molecular dimensional high density recording is possible, and in addition the erasing and reproduction of information can be carried out repeatedly. With the display media of the invention, high-density images can be displayed with high degrees of resolution. The recording media of the invention permit not only relatively easy recording of inforamtion but also recording of high sensitivity and high degree of resolution.

What is claimed is:

1. A method for forming a monomolecular film or monomolecular-layer built-up film of a clathrate complex compound, which comprises; dissolving host molecules having a hydrophilic portion, a hydrophobic portion, and a portion capable of enclosing guest molecules together with the guest molecules, in a solvent; extending the resulting solution on a water surface to form a monomolecular layer of the clathrate complex compound composed of said host and guest molecules; and transferring said layer onto a substrate to form the intended monomolecular film or built-up film.

2. The film forming method of claim 1, wherein the substrate is formed of the material selected from the group consisting of glass, aluminum, plastics, and ceramics.

3. A method for forming a monomolecular film or monomolecular-layer built-up film of a clathrate complex compound, which comprises; dissolving host molecules together with or without guest molecules in a solvent, said host molecules having a hydrophilic portion, a hydrophobic portion, and a portion capable of enclosing the guest molecule; extending the resulting solution on the surface of an aqueous solution of water soluble guest molecules to form a monomolecular layer of a clathrate complex compound composed of said host and guest molecules; and transferring said layer onto a substrate to form a monomolecular film or a built-up film.

4. The film forming method of claim 3, wherein the substrate is formed of the material selected from the group consisting of glass, aluminum, plastics, or ceramics.

5. The film forming method of claim 3, wherein said layer is transferred to the substrate in an atmosphere of gas of the guest molecule compound.

* * * * *

UNITED STATES PATENT AND TRADEMARK OFFICE
CERTIFICATE OF CORRECTION

PATENT NO. : 4,753,830
DATED : June 28, 1988
INVENTOR(S) : HIROSHI MATSUDA, ET AL.     Page 1 of 4

It is certified that error appears in the above-identified patent and that said Letters Patent is hereby corrected as shown below:

COLUMN 1

Line 57, "so-call" should read --so-called--.

COLUMN 2

Line 3, "abovementioned" should read --above-mentioned--.
Line 13, "tion" should read --tions--.

COLUMN 3

Line 28, "Still" should read --A still--.
Line 66, "comprises;" should read --comprises:--.

COLUMN 4

Line 4, "water soluble" should read --water-soluble--.

COLUMN 6

Line 13, "m and an" should read --m and n--.
Form 7, "-C≡C≡C≡C-" should read -- -C≡C-C≡C- --.

COLUMN 7

Form 13, "$80 \geq m+n \geq 18, n \geq 0$" should read --$30 \geq m+n \geq 13, n \geq 0$--.

UNITED STATES PATENT AND TRADEMARK OFFICE
CERTIFICATE OF CORRECTION

PATENT NO. : 4,753,830
DATED : June 28, 1988
INVENTOR(S) : HIROSHI MATSUDA, ET AL.

It is certified that error appears in the above-identified patent and that said Letters Patent is hereby corrected as shown below:

COLUMN 11

Line 54, "monomecular" should read --monomolecular--.

COLUMN 13

Form 34, "$R_2=CH_3$ or" should read --$R_2=-CH_3$ or--.

COLUMN 14

Line 65, "luminescene" should read --luminescence--.

COLUMN 15

Line 66, "monomecular" should read --monomolecular-- and "monomecu-" should read --monomolecu- --.

COLUMN 16

Line 13, "(k: Boltzman's constant;" should read --(k: Boltzmann's constant;--.

COLUMN 17

Line 10, "monomecular" should read --monomolecular--.
Line 27, "fomred" should read --formed--.
Line 42, "layer" should read --layers--.
Line 49, "substrate" should read --substrates--.

UNITED STATES PATENT AND TRADEMARK OFFICE
CERTIFICATE OF CORRECTION

PATENT NO. : 4,753,830
DATED : June 28, 1988
INVENTOR(S) : HIROSHI MATSUDA, ET AL.

It is certified that error appears in the above-identified patent and that said Letters Patent is hereby corrected as shown below:

COLUMN 18

Line 9, "usch" should read --such--.
Line 38, "close" should read --closed--.
Line 67, "bonds" should read --bond--.

COLUMN 19

Line 53, "CaS layer" should read --CdS layer--.

COLUMN 21

Line 35, "sources" should read --serves--.

COLUMN 23

Line 13, "plates." should read --plate.--

COLUMN 24

Line 23, "should" should read --showed--.
Line 39, "monomecular" should read --monomolecular--.

COLUMN 25

Line 45, "the" (first occurrence) should be deleted.

COLUMN 26

Line 38, "irradaited" should read --irradiated--.

UNITED STATES PATENT AND TRADEMARK OFFICE
CERTIFICATE OF CORRECTION

PATENT NO. : 4,753,830
DATED : June 28, 1988
INVENTOR(S) : HIROSHI MATSUDA, ET AL.

It is certified that error appears in the above-identified patent and that said Letters Patent is hereby corrected as shown below:

COLUMN 27

Line 36, "specd" should read --speed--.

COLUMN 28

Line 56, "builtup" should read --built-up--.

COLUMN 29

Line 33, "inforamtion" should read --information--.

COLUMN 30

Line 3, "comprises;" should read --comprises:--.
　　Line 18, comprises;" should read --comprises:--.
　　Line 23, "water" should read --water- --.

Signed and Sealed this

Tenth Day of October, 1989

Attest:

DONALD J. QUIGG

Attesting Officer　　　Commissioner of Patents and Trademarks